(12) United States Patent
Kondo

(10) Patent No.: US 7,662,666 B2
(45) Date of Patent: Feb. 16, 2010

(54) METHOD OF PROCESSING WAFER

(75) Inventor: Koichi Kondo, Ota-ku (JP)

(73) Assignee: Disco Corporation, Tokyo (JP)

( * ) Notice: Subject to any disclaimer, the term of this patent is extended or adjusted under 35 U.S.C. 154(b) by 72 days.

(21) Appl. No.: 11/998,045

(22) Filed: Nov. 28, 2007

(65) Prior Publication Data
US 2008/0132035 A1 Jun. 5, 2008

(30) Foreign Application Priority Data
Nov. 30, 2006 (JP) ............................. 2006-324921

(51) Int. Cl.
H01L 21/00 (2006.01)
(52) U.S. Cl. ................. 438/109; 438/112; 438/462; 438/465; 257/E21.508; 257/E23.039; 257/E23.129; 257/E25.013
(58) Field of Classification Search ......... 438/458–460, 438/108–116, 462–465; 257/E21.238, 599, 257/E21.508, 23.039, 129, 25.013
See application file for complete search history.

(56) References Cited

U.S. PATENT DOCUMENTS

| 6,118,179 | A * | 9/2000 | Farnworth et al. ......... 257/734 |
| 6,399,178 | B1 * | 6/2002 | Chung ....................... 428/131 |
| 6,582,992 | B2 * | 6/2003 | Poo et al. ................... 438/109 |
| 6,613,606 | B1 * | 9/2003 | Lee ............................ 438/108 |
| 6,656,827 | B1 * | 12/2003 | Tsao et al. .................. 438/612 |
| 6,710,454 | B1 * | 3/2004 | Boon .......................... 257/777 |
| 6,803,247 | B2 * | 10/2004 | Sekiya ......................... 438/33 |
| 6,821,878 | B2 * | 11/2004 | Danvir et al. ............... 438/613 |
| 6,893,904 | B2 * | 5/2005 | Akram ....................... 438/127 |
| 6,900,110 | B1 * | 5/2005 | Takiar et al. ................ 438/421 |
| 6,908,784 | B1 * | 6/2005 | Farnworth et al. .......... 438/106 |
| 6,992,398 | B2 * | 1/2006 | Farnworth ................... 257/778 |
| 6,995,041 | B2 * | 2/2006 | Connell et al. .............. 438/112 |
| 7,057,133 | B2 * | 6/2006 | Lei et al. ................ 219/121.71 |
| 7,129,114 | B2 * | 10/2006 | Akram ....................... 438/110 |
| 7,265,032 | B2 * | 9/2007 | Sharan et al. ............... 438/460 |
| 7,368,812 | B2 * | 5/2008 | Akram ....................... 257/686 |
| 7,425,462 | B2 * | 9/2008 | Tan et al. .................... 438/106 |
| 7,514,291 | B2 * | 4/2009 | Akram ....................... 438/110 |

FOREIGN PATENT DOCUMENTS

JP 2002-033342 1/2002
WO WO 2004/034422 4/2004

* cited by examiner

Primary Examiner—Michael S Lebentritt
(74) Attorney, Agent, or Firm—Greer, Burns & Crain, Ltd.

(57) ABSTRACT

An underfill material is provided on the surface of a wafer in such a manner as to cover bumps, then the wafer is irradiated with a laser beam from the surface thereof and along planned cutting lines so as to remove an insulation layer and the underfill material present over the planned cutting lines, and the debris generated in this instance are deposited on the underfill material and are thereby prevented from being deposited on the wafer surface and/or on the bumps. Subsequently, a surface layer of the underfill material is cut so as to make the bumps flush in height and to expose the tips of the bumps.

1 Claim, 4 Drawing Sheets

METHOD OF PROCESSING WAFER

BACKGROUND OF THE INVENTION

1. Field of the Invention

The present invention relates to a method of processing a wafer which is carried out as a pre-treatment of a wafer, such as a semiconductor wafer, in cutting and splitting the wafer into a plurality of individual devices such as semiconductor chips.

2. Description of the Related Art

As one of semiconductor chip mounting means, there has generally been used the mode of wire bonding in which an electrode pad and a lead frame, in a semiconductor chip joined to the lead frame, are connected to each other through metallic wires. However, reductions in size and thickness of electronic apparatuses using the semiconductor chips have been demanded more and more in recent years, and, in order to meet the demand, flip chips and the like have been developed and put to practical use. The flip chip pertains to the technology in which a plurality of projected electrodes called bumps having a height of about 15 to 100 µm, for example, are formed on the surface of the semiconductor chip, and the bumps are joined directly to electrodes present on the mounting substrate side. In some cases of the flip chip, an underfill material is placed between the electrodes on the wafer surface prior to splitting the wafer, for the purpose of preventing short-circuiting from occurring between the electrodes (refer to Japanese Patent Laid-open No. 2002-033342 and JP-A-2005-538572). As the underfill material, insulating resins such as epoxy and polyimide resins are used favorably.

In the recent semiconductor device technology, an insulation layer called "low-k" has been adopted for forming a wiring layer on the chip surface. The insulation layer is provided for lowering the permittivity to thereby smoothen the flow of electrical signals. However, when dicing in which a wafer is cut by a rotary blade containing diamond abrasive grains is conducted in splitting the wafer into a multiplicity of discrete chips, the insulation layer would be exfoliated or crushed because of its brittleness. In view of this, practically, only the insulation layer is first cut by a cutting method free of exertion of physical stresses, such as by irradiation with a laser beam, and thereafter the main body part (formed principally of single crystal silicon) of the wafer is cut by dicing or by irradiation with a laser beam.

Meanwhile, when a wafer is cut by irradiation with a laser beam, the heated wafer material (the wafer itself or the insulation layer) may be transpired, and the transpired component(s) may be deposited on the wafer surface, causing troubles such as short-circuit. The transpired component(s) deposited on the wafer surface are called debris, and, in the case of a chip of the type in which wiring is conducted by the above-mentioned wire bonding method, the debris can be easily removed by forming a protective film on the wafer surface. More specifically, the debris can be removed by a method in which irradiation with a laser beam is conducted while permitting deposition of the debris on a protective film and then the protective film is peeled off.

However, in the case where the above-mentioned bumps are formed on the wafer surface, it has been difficult to form the protective film in a good state on the wafer surface. This is because the material ordinarily used for forming the protective film is a solution, such as a water-soluble resist, and its properties are unsuitable for covering the projected parts.

SUMMARY OF THE INVENTION

Accordingly, it is an object of the present invention to provide a method of processing a wafer by which deposition of debris, generated upon irradiation of a wafer with a laser beam along planned cutting lines in cutting and splitting the wafer into a plurality of devices having projected electrodes, on the wafer surface and/or on the projected electrodes can be effectively prevented and, as a result, an enhanced productivity can be promised.

In accordance with an aspect of the present invention, there is provided a method of processing a wafer, for cutting, along planned cutting lines, a wafer in which a plurality of devices formed on a surface of the wafer are demarcated from each other by the planned cutting lines, the devices being provided with projected electrodes at surfaces thereof, the method including: a covering step for covering a surface of the wafer with an underfill material; a laser beam irradiation step for irradiating the wafer with a laser beam from the surface and along the planned cutting lines so as to remove at least the underfill material present over the planned cutting lines; and a cutting step for cutting a face layer of the underfill material so as to expose the electrodes.

Preferably, the underfill material used for covering the surface of the wafer in the covering step is composed of an insulating resin, such as epoxy and polyimide resins. The underfill material is extremely suitable as a covering material for evenly covering the wafer surface, which is rugged due to projection of the projected electrodes, and for sufficiently protecting the wafer surface and the electrodes. In the laser beam irradiation step, the underfill material present over the planned cutting lines is removed by the laser beam with which the wafer surface is irradiated from the surface, and the debris generated through transpiration of the underfill material and/or wafer component(s) in this instance are deposited on the underfill material. Namely, deposition of the debris on the electrodes and/or on the wafer surface between the electrodes can be prevented by the underfill material.

In the cutting step, the projected electrodes are exposed to the surface of the underfill material, and they are made flush in height. The wafer is thereafter cut and split along the planned cutting lines, into a plurality of discrete devices. As the cutting method for cutting and splitting the wafer into the discrete devices, any of such methods as dicing or irradiation with a laser beam may be adopted. As another method for the cutting and splitting, there is a pre-dicing method in which the irradiation with a laser beam is made to proceed into the inside of the wafer so as to provide the wafer with grooves having a depth corresponding to an objective thickness, in the laser beam irradiation step in the present invention, and thereafter the wafer is thinned by grinding its back side until the grooves are exposed on the back side of the wafer.

The wafer as a work in the present invention includes those in which an insulation layer is formed on a wafer surface. In this case, in the covering step, the surface of the insulation layer is covered with an underfill material, and, in the laser beam irradiation step, at least the insulation layer and the underfill material are removed. While the insulation layer would be exfoliated or crushed if it is cut by dicing, the irradiation with a laser beam promises a comparatively smooth cutting. The debris, having been a cause of the problem in the laser beam irradiation technique, are deposited on the underfill material as above-mentioned, so that the debris are prevented from being deposited on the wafer surface and/or on the projected electrodes. In short, both smooth cutting by irradiation with a laser beam and prevention of the deposition of debris on the wafer surface and/or on the electrodes can be realized simultaneously.

The covering of the surface of the wafer with the underfill material in the covering step can be achieved not only by application of a solution form underfill material but also by adhesion of a film-shaped material.

The present invention resides in a method in which the surface of the wafer is covered with the underfill material, then irradiation with a laser beam along the planned cutting lines is conducted to remove at least the underfill material, and then the cutting step is conducted so as to make the projected electrodes flush in height. Through such a sequence of steps, the debris generated upon irradiation with a laser beam can be effectively prevented from being deposited on the wafer surface and/or on the projected electrodes, and, as a result, an enhanced productivity is promised.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1A:
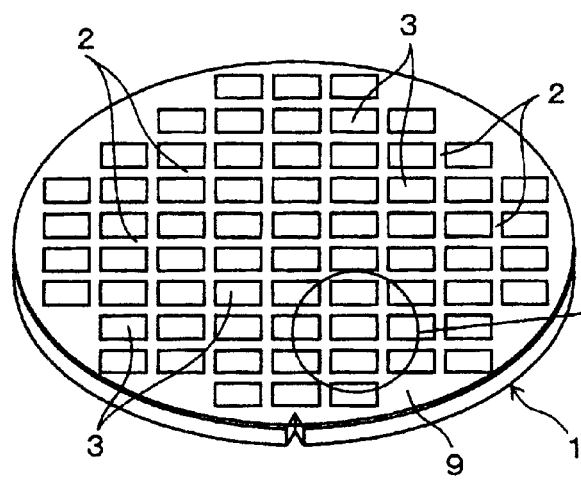
FIG. 1A is a perspective view of a wafer to be cut in an embodiment of the present invention.

Now, an embodiment of the present invention will be described below referring to the drawings.

[1] Semiconductor Wafer

Reference numeral 1 in FIG. 1A denotes an example of a circular disk-shaped semiconductor wafer (hereinafter referred to simply as "the wafer") to be subjected to cutting according to an embodiment of the present invention. The wafer 1 is a silicon wafer or the like, having a thickness of about 800 μm, for example. On the surface of the wafer 1, a plurality of rectangular semiconductor chips (devices) 3 are demarcated by planned cutting lines 2 formed in a lattice pattern. Electronic circuits (not shown) such as ICs and LSIs are formed on the surfaces of these semiconductor chips 3.

Figure 1B:
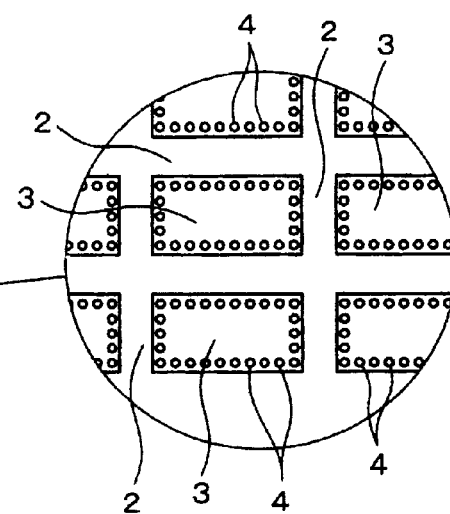
FIG. 1B is an enlarged plan view of semiconductor chips.
Figure 1C:
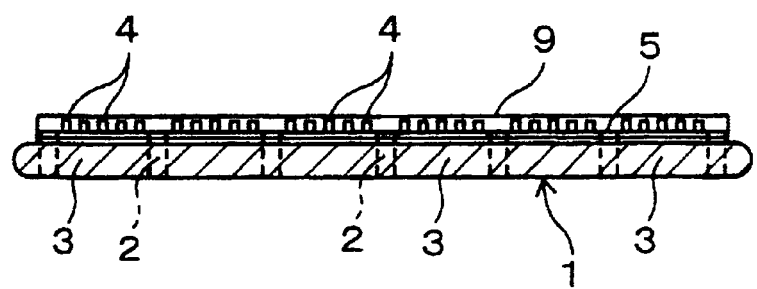
FIG. 1C is a side view of the wafer.

As shown in FIGS. 1B and 1C, each of the semiconductor chips 3 is provided with a plurality of bumps 4 projected from the surface thereof. The bumps 4 are projected electrodes joined to electrodes of an electronic circuit formed on the semiconductor chip 3, and are formed by a conventionally known stud bump forming method or the like; in most cases, the bumps 4 are not flush in height. In addition, as shown in FIG. 1C, a wiring layer is formed on the surface of the wafer 1 by use of an insulation layer (called "low-k" in some cases) 5. This kind of wiring layer has the function of lowering the permittivity to thereby make smoother the flow of electrical signals.

[2] Wafer Processing Method

The wafer 1 is cut and split along the planned cutting lines 2 into a plurality of discrete semiconductor chips 3. Prior to the cutting and splitting, the wafer 1 is subjected to the following processing according to the present invention.

(I) Covering Step

Figure 2A:
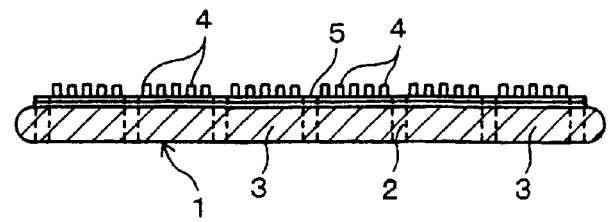
FIGS. 2A to 2E are partly sectional side views illustrating the wafer processing method according to an embodiment of the present invention, in the order of steps.
Figure 2B:
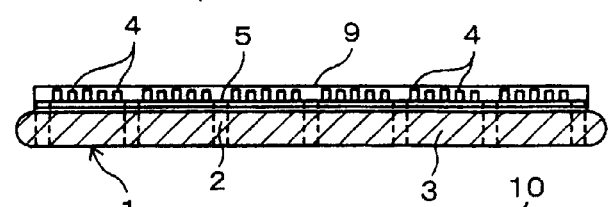

The surface of the not-yet-processed wafer 1 shown in FIG. 2A is covered with an underfill material 9 so as to embed all the bumps 4 in the underfill material 9. FIGS. 1A, 1C and 2B show the condition where the surface of the wafer 1 is covered with the underfill material 9. The underfill material 9 is composed of an insulating resin such as epoxy and polyimide resins, and is provided on the surface of the wafer 1 by a method in which a solution is applied and solidified or a film-shaped material is adhered.

As the solution applying method, there may be preferably adopted, for example, a spin coating method in which the wafer 1 is fixed on a rotary table and rotated, a solution of an underfill material 9 liquefied at a high temperature is dropped down to a central part of the surface of the wafer 1, and the solution is spread throughout the surface of the wafer 1 by centrifugal forces so as to coat the surface. In addition, the film of an underfill material 9 can be adhered, for example, by a method in which the film is laminated on the surface of the wafer 1, is then heated, and is left to stand until its temperature is lowered to normal temperature. Incidentally, examples of the film for use as the underfill material 9 include FF7675, a product by Xynyx. By one of these methods, the underfill material 9 is evenly provided on the surface of the wafer 1 in the state of covering all the bumps 4.

(II) Laser Beam Irradiation Step

Figure 2C:
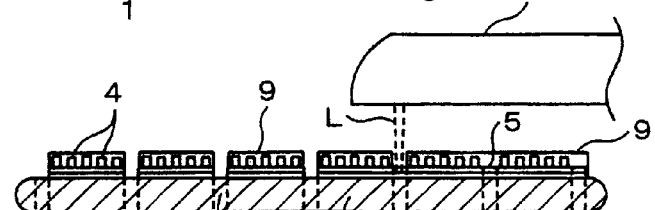

As shown in FIG. 2C, the wafer 1 is irradiated with a laser beam L from the surface thereof and along the planned cutting lines 2, to remove at least the under fill material 9 and the insulation layer 5 present over the planned cutting lines 2. Examples of the laser beam L radiated from a laser head 10 include those which have the following characteristics.

Solid state laser such as YVO4 laser, YAG laser

Wavelength: 355 nm

Method of Oscillation: pulsed oscillation

Pulse width: 10 to 100 ns

Condensed spot diameter: $\phi$5 to 20 μm

Repetition frequency: 50 to 100 kHz

Average output: 1 to 10 W

Processing feed rate: 50 to 400 mm/sec

Figure 3A:
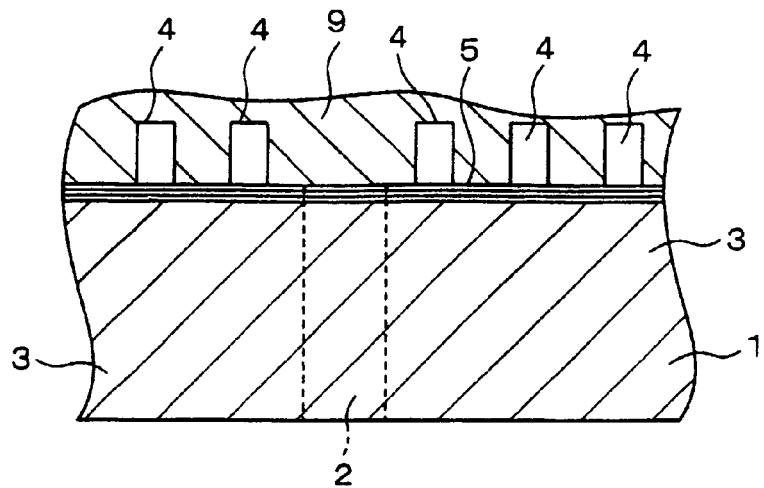
FIGS. 3A to 3C are sectional views illustrating essential points in the processing method according to an embodiment of the present invention.
Figure 3B:
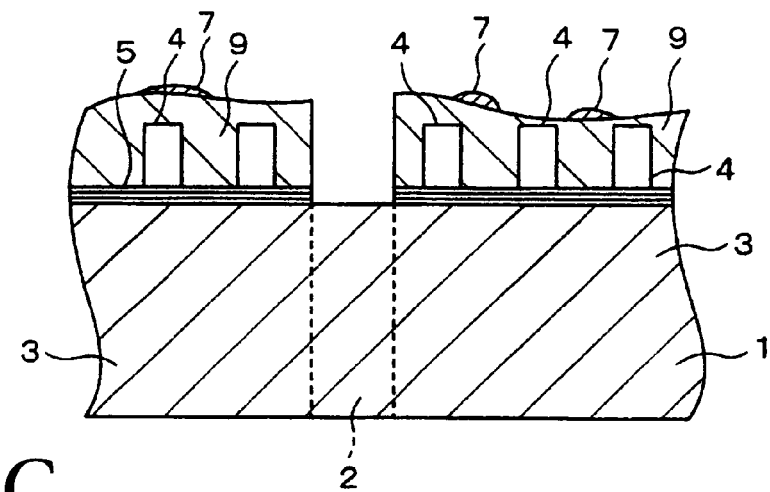

When the underfill material 9 and the insulation layer 5 present over the planned cutting line 2 is radiated with the laser beam L, the underfill material 9 and the insulation layer 5 are heated, and are removed through transpiration. The irradiation with the laser beam L may be so conducted that the laser beam L reaches a predetermined depth in the wafer 1, and, in that case, the laser beam-irradiated part of the wafer 1 is also removed through transpiration, whereby a groove is formed in the planned cutting line 2 in the wafer 1. Here, the transpired components generated upon irradiation with the laser beam are deposited as debris on the surface of the wafer 1; in the present method, however, due to the covering with the underfill material 9, the debris 7 are deposited on the underfill material 9, as shown in FIG. 3B. Therefore, such troubles as direct deposition of the debris 7 on the bumps 4 and/or on the surface of the wafer 1 between the bumps 4 are prevented from occurring.

(III) Cutting Step

Figure 2D:
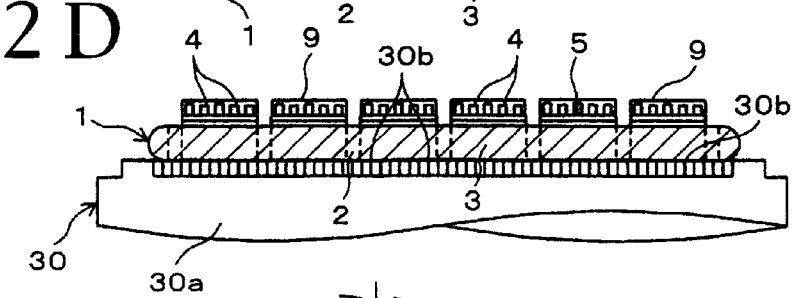

As shown in FIG. 2D, the wafer 1 is mounted on a chuck table 30 of a vacuum chuck system, and is held on the chuck table 30 by suction under a vacuum action. The chuck table 30 is of a pin chuck system in which a multiplicity of pins 30b are erectingly provided on a surface of a circular disk-shaped base 30a, and is formed of stainless steel such as SUS430, for example. The wafer 1 is held by suction on a horizontal holding surface composed of tips of the multiplicity of pins 30b, with its back side in contact with the tips of the pins 30b and with its surface directed upwards.

Figure 2E:
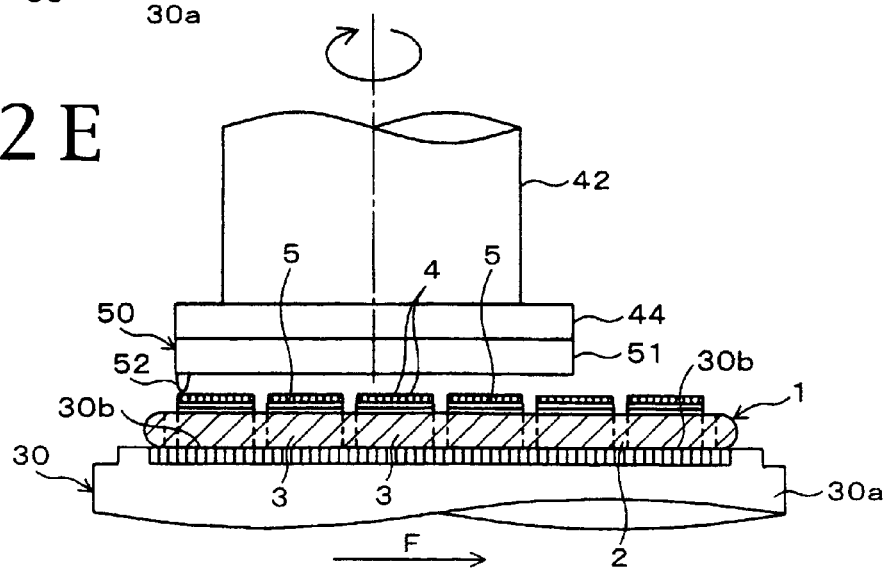

Next, as shown in FIG. 2E, a surface layer part of the underfill material 9 is cut by a machining tool 50 disposed over the chuck table 30, whereby the surface of the underfill material 9 is processed to be flat, and the tips of all the bumps 4 are cut so as to expose the tips at the surface of the underfill material 9. The machining tool 50 has a cutting tool 52 firmly attached to a lower surface of an annular frame 51, and the frame 51 is detachably attached by screwing or the like means to a flange 44 fixed to the lower end of a spindle shaft 42. The cutting tool 52 has a structure in which a cutting part formed of diamond or the like is firmly attached to the tip thereof. The machining tool 50 is rotated together with the spindle shaft 42 at a high speed, and the cutting surface composed of the rotational locus of the cutting tool 52 in this case is substantially horizontal.

In order to cut a surface layer of the underfill material 9 so as to make the bumps 4 flush in height, the spindle shaft 42 is lowered until the distance from the surface of the wafer 1 (the surface of the insulation layer 5) to the tip of the cutting tool 52 becomes equal to the desired height of the bumps 4, and, simultaneously, the machining tool 50 is rotated at a high speed. Starting from this condition, either one or both of the spindle shaft 42 and the chuck table 30 are moved horizontally in the direction(s) for approaching each other. In FIG. 2E, the spindle shaft 42 is not moved in a horizontal direction, while the chuck table 30 is moved in the direction of arrow F. This ensures that the surface layer of the underfill material 9 is gradually cut by the cutting tool 52 of the machining tool 50, and the machining tool 50 is moved to pass over the wafer 1, whereby the whole surface of the underfill material 9 is cut to be horizontal. At the surface of the underfill material 9, the tips of all the bumps 4 thus cut are exposed in a flush state.

Figure 3C:
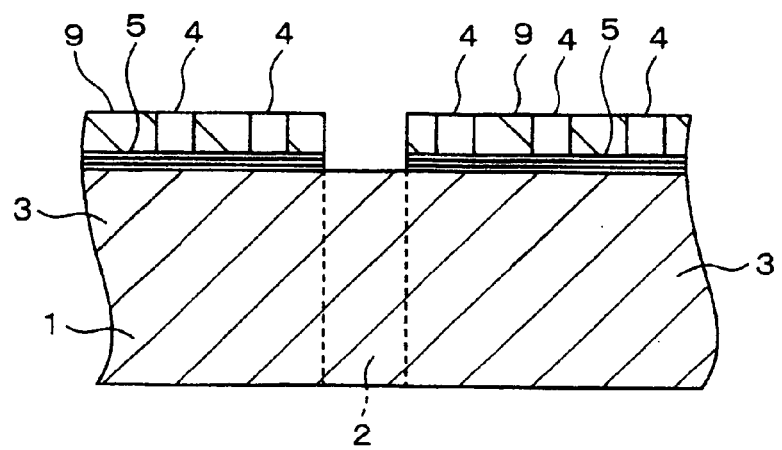

The processing method in this embodiment is as described above, and FIGS. 3A-3C show, in an enlarged form, the section of the surface layer part of the wafer 1 in each of the above-mentioned steps. In this processing method, the underfill material 9 used for covering the surface of the wafer 1 in the covering step is composed of an insulating resin such as epoxy and polyimide resins, which is extremely suitable as a covering material for evenly covering the surface of the wafer 1 forming a rugged surface due to the projection of the bumps 4 and for sufficiently protecting the surface of the wafer 1 and the bumps 4.

In the subsequent laser beam irradiation step, the underfill material 9 and the insulation layer 5 present over the planned cutting lines 2 are removed by use of a laser beam. As shown in FIG. 3B, the debris 7 generated in this instance are deposited on the underfill material 9, so that they do not affect the bumps 4 and the surface of the wafer 1 between the bumps 4 at all. Therefore, such troubles as short-circuit can be prevented from being generated. Upon the cutting step, the debris 7 disappear, and the tips of the bumps 4 made flush in height are exposed at the surface of the underfill material 9. Besides, in the cutting step, such troubles as a trouble in which the cutting chips and the like are caught between the holding surface of the chuck table 30 for suction-holding the wafer 1 and the back side of the wafer 1 to cause a distortion in the holding condition will hardly be generated, since the chuck table 30 is of the pin chuck system. This is because the cutting chips drop between the pins 30b, and are hardly deposited on the tips of the pins 30b. This is very effective in the case where the dispersion among the heights of the bumps 4 is controlled to about 1 to 2 μm.

The wafer 1 processed as above-mentioned is then cut and split along the planned cutting lines 2 into a plurality of discrete semiconductor chips 3. As the cutting method in this case, methods such as dicing and irradiation with a laser beam may be adopted. The cutting and splitting into the discrete semiconductor chips can be achieved also by a pre-dicing method in which the laser beam L is made to reach the inside of the wafer 1 so as to provide the wafer 1 with grooves having a depth corresponding to the thickness of the semiconductor chips 3 to be obtained finally, in the laser beam irradiation step, and thereafter the wafer 1 is thinned by grinding its back side until the grooves are exposed on the back side of the wafer 1.

Figure 4:
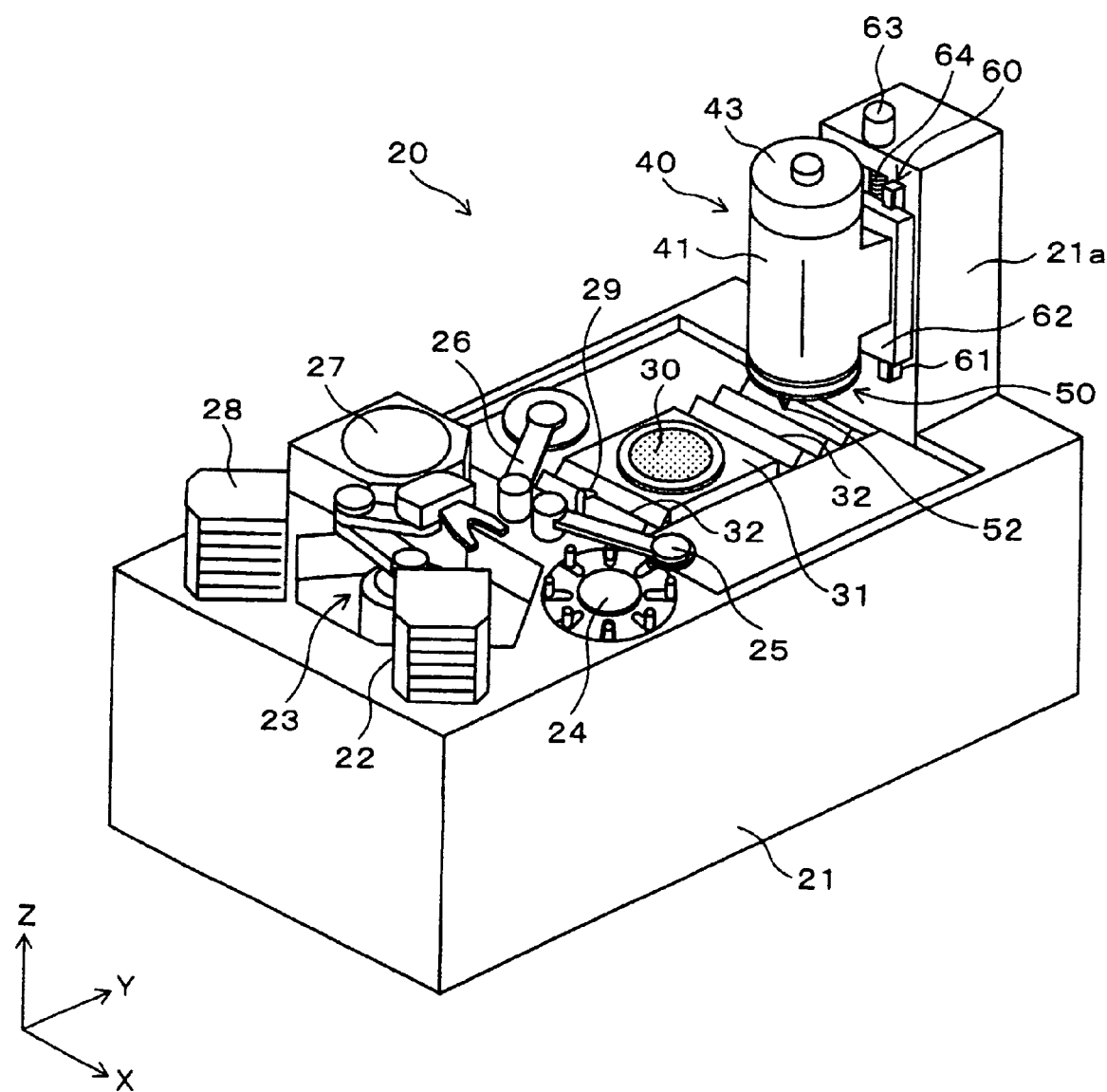
FIG. 4 is a general perspective view of a cutting apparatus preferable for cutting the surface of a wafer.

Specifically, the cutting step as above can be carried out by use of a cutting apparatus 20 shown in FIG. 4. Now, the configuration and the cutting operation of the cutting apparatus 20 will be described below. The cutting apparatus 20 has a rectangular parallelopiped base 21, and a predetermined number of wafers 1 as works are stackedly contained in a cassette 22 set in a predetermined position on the base 21. One of the wafers 1 is taken out of the cassette 22 by a feeding robot 23, is mounted on a positioning table 24 in the condition where its surface to be cut is directed upwards, and the wafer 1 is positioned in a fixed position.

The wafer 1 positioned on the positioning table 24 is picked up under suction from the positioning table 24 by a supplying arm 25, and is mounted onto the chuck table 30 standing by at a holding/releasing position. The chuck table 30 is supported rotatably or fixedly on a moving base 31 reciprocated in the Y direction, and is reciprocated between a cutting position on the depth side in the Y direction and the holding/releasing position on this side (the viewer's side) in the Y direction, through the moving base 31. Incidentally, at both end parts in the moving direction of the moving base 31, bellows-like covers 32 for covering the moving path of the moving base 31 so as to prevent cutting chips or the like from dropping into the moving path are provided in an expandable and contractible manner.

The chuck table 30 is of the pin chuck system as shown in FIGS. 2A to 2E, and holds by suction the wafer 1 on a flat holding surface formed by the tips of a multiplicity of pins. The chuck table 30 is preliminarily set in a vacuum suction operation, so that the wafer 1 is held onto the holding surface by suction simultaneously when it is mounted on the chuck table 30.

Next, the wafer 1 is moved in the direction of the cutting position through the moving base 31 and the chuck table 30, and, during the movement, its surface (the surface of the underfill material 9) is cut by a spindle unit 40 disposed on the upper side. The spindle unit 40 has a hollow cylindrical spindle housing 41 having an axial direction set to extend in the Z direction. Inside the spindle housing 41, the spindle shaft 42 as shown in FIG. 2E is supported coaxially and rotatably. The spindle shaft 42 is driven to rotate by a spindle motor 43 fixed to an upper end part of the spindle housing 41. The circular disk-shaped flange 44 is coaxially fixed to the lower end of the spindle shaft 42 as shown in FIG. 2E, and the machining tool 50 having the frame 51 and the cutting tool 52 is fixed to the flange 44.

The spindle unit 40 is supported on a wall part 21a erectingly provided at an end part, on the depth side in the Y direction, of the base 21 so that it can be moved up and down through a feeding mechanism 60. The feeding mechanism 60 is composed of a Z-axis linear guide 61 fixed to a front surface of the wall part 21a and extending in the Z direction, a Z-axis slider 62 so mounted as to be slidable along the Z-axis linear guide 61, and a ball screw 64 which is driven to rotate by a servo motor 63 and which, by rotating, moves the Z-axis slider 62 in the Z direction, i.e., vertically. In the spindle unit 40, the spindle housing 41 is fixed to the Z-axis slider 62.

In order to cut the bumps 4 of the wafer 1 held on the chuck table 30, the spindle unit 40 is lowered by the feeding mechanism 60 until the distance from the surface of the wafer 1 (the surface of the insulation layer 5) to the tip of the cutting tool 52 becomes equal to the objective height of the bumps 4, and the machining tool 50 is rotated at a high speed of 1000 rpm, for example. Then, the moving base 31 is moved in the direction of the cutting position on the lower side of the spindle unit 40 at a predetermined speed. As a result, the surface layer of the underfill material 9 is gradually cut by the cutting tool 52 of the machining tool 50, and, eventually, all the bumps 4 are cut to be flush in height. Incidentally, if the chuck table 30 is configured to be rotatable, the cutting processing may be conducted while the wafer 1 is being rotated by rotating the chuck table 30.

When the cutting of the surface of the wafer 1 so as to make the bumps 4 flush in height is finished, the moving base 31 is moved toward this side (the viewer's side) in the Y direction to position the wafer 1 into the holding/releasing position, and the vacuum suction operation of the chuck table 30 is stopped, resulting in the condition where the wafer 1 can be released from the chuck table 30. Subsequently, the wafer 1 is fed by a recovering arm 26 from the position on the chuck table 30 onto a spinner type cleaning apparatus 27, to be cleaned and dried there. Thereafter, the wafer 1 is transferred by the feeding robot 23 into a recovering cassette 28, to be contained there. The chuck table 30 from which the wafer 1 is removed is deprived of the cutting chips and the like by cleaning water jetted from a cleaning nozzle 29. The operations as above-mentioned are repeated, whereby cutting of the surfaces of a multiplicity of wafers is carried out.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of processing a wafer, for cutting, along planned cutting lines, a wafer in which a plurality of devices formed on a surface of the wafer are demarcated from each other by the planned cutting lines, said devices being provided with projected electrodes at surfaces thereof, and an insulation layer is formed on the surface of said wafer, said method comprising sequentially performing:
   a covering step for covering a surface of said insulation layer with a film-like underfill material;
   a laser beam irradiation step for irradiating said wafer with a laser beam from a surface of said underfill material and along said planned cutting lines so as to remove at least said underfill material and said insulation layer present over said planned cutting lines; and
   a cutting step for cutting a face layer of said underfill material so as to expose said projected electrodes and make the projected electrodes flush in height.

* * * * *